United States Patent
Sathik et al.

(10) Patent No.: US 11,248,966 B2
(45) Date of Patent: Feb. 15, 2022

(54) HEALTH MONITORING AND FAILURE PROGNOSIS OF POWER ELECTRONICS DEVICES

(71) Applicant: ROLLS-ROYCE plc, London (GB)

(72) Inventors: Mohamed H. M. Sathik, Singapore (SG); Rejeki Simanjorang, Singapore (SG); Chandana J. Gajanayake, Singapore (SG); Sundararajan Prasanth, Singapore (SG); Amit K. Gupta, Singapore (SG)

(73) Assignee: ROLLS-ROYCE plc, London (GB)

( * ) Notice: Subject to any disclaimer, the term of this patent is extended or adjusted under 35 U.S.C. 154(b) by 244 days.

(21) Appl. No.: 16/437,371

(22) Filed: Jun. 11, 2019

(65) Prior Publication Data
US 2019/0383670 A1    Dec. 19, 2019

(30) Foreign Application Priority Data
Jun. 18, 2018  (GB) .................................... 1809915

(51) Int. Cl.
| G01K 7/00 | (2006.01) |
| G01K 3/00 | (2006.01) |
| G01K 1/00 | (2006.01) |
| G01K 7/16 | (2006.01) |
| H02P 29/60 | (2016.01) |

(Continued)

(52) U.S. Cl.
CPC .............. *G01K 7/16* (2013.01); *G01K 7/01* (2013.01); *H02P 29/60* (2016.02); *H02P 29/024* (2013.01)

(58) Field of Classification Search
USPC ...................... 374/183, 178, 142, 110, 166
See application file for complete search history.

(56) References Cited

U.S. PATENT DOCUMENTS

| 4,636,092 A * | 1/1987 | Hegyi ...................... G01K 7/01 |
| | | 327/339 |
| 4,764,026 A | 8/1988 | Powell et al. |

(Continued)

FOREIGN PATENT DOCUMENTS

| CN | 103822731 B | 8/2016 |
| CN | 106124957 A | 11/2016 |

(Continued)

OTHER PUBLICATIONS

Jan. 2, 2019 Search Report issued in British Patent Application No. 1809915.0.

(Continued)

*Primary Examiner* — Mirellys Jagan
(74) *Attorney, Agent, or Firm* — Oliff PLC

(57) ABSTRACT

A system, method and machine-readable instructions for monitoring a power electronics device. The system involves a semiconductor device, at least one sensor and a processor. The processor is configured to monitor a junction temperature of the semiconductor device by determining from the at least one sensor an on-state resistance of the semiconductor device and calculating the junction temperature of the semiconductor device according to a relationship between the on-state resistance of the semiconductor device and the junction temperature of the semiconductor device. The processor may apply an ageing coefficient to the on-state resistance.

18 Claims, 6 Drawing Sheets

(51) Int. Cl.
*G01K 7/01* (2006.01)
*H02P 29/024* (2016.01)

(56) References Cited

U.S. PATENT DOCUMENTS

| | | | |
|---|---|---|---|
| 7,988,354 B2 * | 8/2011 | Jansen | G01K 7/16 |
| | | | 374/170 |
| 2007/0158776 A1 * | 7/2007 | Julio | G01K 7/01 |
| | | | 257/486 |
| 2012/0201272 A1 | 8/2012 | Schuler | |
| 2018/0372553 A1 * | 12/2018 | Ewanchuk | H03K 17/122 |

FOREIGN PATENT DOCUMENTS

| | | |
|---|---|---|
| EP | 3 435 099 A1 | 1/2019 |
| KR | 101531018 B1 | 6/2015 |

OTHER PUBLICATIONS

Sep. 6, 2019 Search and Examination Report issued in British Patent Application No. 1908228.8.

* cited by examiner

HEALTH MONITORING AND FAILURE PROGNOSIS OF POWER ELECTRONICS DEVICES

BACKGROUND OF THE DISCLOSURE

The present disclosure concerns health monitoring and failure prognosis of power electronics equipment, such as power converters, and more specifically, health monitoring and failure prognosis of power semiconductor devices, such as insulated-gate bipolar transistors (IGBTs), within power electronics equipment.

It is estimated that about 38% of the faults in variable speed drive systems are due to failure of power electronics equipment. In particular, power device failure is critical, especially in aerospace and marine applications. These applications usually require thermal management systems to ensure protection of the power electronics device from thermal runaway failure. Regardless of the extensive effort to improve their reliability, failure of power electronics device is an ongoing problem.

IGBTs are known to suffer from failures due to electrical and thermal stresses as a result of many power converters being continuously operated with highly inductive loads with varying operating currents. Moreover, their operating conditions can be more adverse when system thermal management is not optimal, and this will eventually trigger wear-out failure. In safety-critical applications, a premature failure could lead to a complete system shutdown, and health monitoring of power electronics equipment is therefore important.

Power semiconductor devices such as insulated gate bipolar transistors (IGBTs) play an important role in various applications such as renewable energy, aerospace and marine drive systems, to achieve efficient electric energy conversion and to attain high performance of the systems. According to recent surveys, semiconductor devices are one of the most fragile parts in power converters, and the reliability of the system is therefore heavily reliant on the non-failure of the semiconductor device. Power converters may be employed in safety critical applications such as starter generators, e-oil, e-fuel or electrical actuation systems in aerospace applications. In such applications, safety and reliability are of the upmost importance.

The two most common reasons for failure of IGBTs are solder fatigue and bond wire lift-off, both of which are mainly triggered by the large co-efficient of thermal expansion (CTE) mismatch in the material interfaces. Usually, the CTE mismatch in the material interfaces is caused by repetitive thermal cycling, which weakens the IGBT layer interfaces over time. Thermal management is therefore essential to the reliability and performance of the IGBT, and in turn, the power converter system. It has been found that the reliability of power electronics equipment depends strongly on the semiconductor device junction temperature, and it is therefore important to monitor the junction temperature during operation of the power electronics device.

Conventionally, the junction temperature of semiconductor devices is estimated using RC thermal network based methods, or temperature sensitive electrical parameters (TSEPs).

FIG. 1 illustrates a conventional system for operating RC Thermal network based methods. Here, a look-up table approach is used to predict the junction temperature. In this model the IGBT inverter system is loaded with cycle data. That is, the electrical conditions at the output of the converter (such as rms voltage and current, power factor, and frequency) are pre-calculated, for example, from a model of a motor drive through the electrical conditions. This allows generation of switching patterns and calculation of the device losses which, in conjunction with the thermal model of the heat sink and packaging, allow the junction temperature to be calculated.

The core of the converter simulation is the lookup table of device losses. The inverter model simply accesses losses that are given as a function of the load current, duty ratio, and device temperature, allowing rapid estimation of the device losses based on the switching conditions at the current time step. The lookup table is pre-calculated using accurate compact device models.

Simple behavioural models, derived from the device experimental measurements may be used to speed up converter modelling sufficiently to allow long load cycles to be simulated. However, such models cannot be used for online estimation of junction temperature, because they cannot predict the effects that changing the circuit and devices would have on the device temperature. In addition, this method doesn't account for the parameter variation and operating condition in estimating the junction temperature. Moreover, accurate thermal modelling of power semiconductor devices requires high accurate switching and conduction losses that requires consideration of the physical switching process, which lasts only about few micro seconds.

FIG. 2 illustrates a TSEP method where estimation of the IGBT junction temperature is based on the device on-state voltage. In this method, the IGBT junction temperature is calculated using the characteristic that the on-state voltage drop of the IGBT is a function of the junction temperature and the collector current. This method consists of two processes, off-line thermal characterization and on-line measurement of the IGBT on-state voltage ($V_{ce,on}$) and the consequent estimation of junction temperature using the previously characterized data.

FIG. 3 illustrates the relationship between gate threshold voltage ($V_{th}$) of an IGBT and its junction temperature. Like on-state voltage ($V_{ce,on}$), threshold voltage ($V_{th}$) also has a good temperature linearity and sensitivity (~10 mV/K), and this makes it another appropriate TSEP.

On-state voltage and threshold voltage are widely used to perform off-line thermal characterization of power semiconductor devices. However, this temperature sensitive electrical parameter approach has many challenges in online implementation. For example, this approach requires high bandwidth sensing elements, alteration in the converter design and complex measurement circuitry. The approach also requires operating conditions such as load current, and temperature to normalize the measured on-state or threshold voltage before being used to obtain the junction temperature. These impracticalities mean such methods are unsuitable for off-the-shelf power converter systems, where change of power converter design is not taken into consideration.

There is proposed a system and/or method for monitoring the junction temperature of semiconductor devices that overcomes or mitigates one or more of these problems.

BRIEF SUMMARY OF THE DISCLOSURE

According to a first aspect there is provided a system for monitoring a power electronics device, the system comprising a semiconductor device; at least one sensor; and a processor; the processor configured to monitor a junction temperature of the semiconductor device by: determining from the at least one sensor an on-state resistance of the semiconductor device; and calculating the junction temperature of the semiconductor device according to a relationship between the on-state resistance of the semiconductor device and the junction temperature of the semiconductor device and calculating the junction temperature of the semiconductor device according to a relationship between the on-state resistance of the semiconductor device based on aged samples lookup table data, and the case temperature of the semiconductor device.

The case temperature of the power semiconductor device may be measured as the temperature of heatsink or liquid cold plate on which the semiconductor is mounted. The heatsink or liquid cold plate is in thermal contact with the semiconductor and power module thereof in order to perform thermal management that dissipates the heat caused by load current.

The case temperature information may be captured by placing a temperature sensor between power device and cold plate or heatsink, or by sensing the temperature by a remote or contact probe.

The at least one sensor may comprise a current and/or voltage sensor. A phase current and/or phase voltage may be sensed by the sensor. The processor may extract from the measured phase current and/or phase voltage a device current and/or a device voltage.

The processor may determine the on-state resistance based on the output of the at least one sensor and an age of the semiconductor device. This may or may not be achieved by calculating a modified on-state resistance of the semiconductor device dependent on the age of the semiconductor device.

The processor may apply an ageing coefficient to the on-state resistance. The processor may determine a change in junction temperature and/or a number of junction temperature calculations. The ageing coefficient may be updated in response to the change in junction temperature being more than a predetermined threshold and/or the number of junction temperature calculations effected being more than a predetermined threshold.

The relationship may comprise a mathematical relationship, lookup table or graph correlating on-state resistance values with junction temperature values.

The relationship may comprise a mathematical curve definition or polynomial relationship.

The processor may output a control and/or alert signal for the semiconductor device based upon the calculated junction temperature being greater than a threshold value. In response to the calculated junction temperature being greater than a predetermined threshold, the processor may output a signal to: shut down the power electronics device; limit further operation of the power electronics device; and/or schedule maintenance, repair and/or replacement of the power electronics device.

The power electronics device/equipment may be/comprise a power converter.

The semiconductor device may comprise an insulated-gate bipolar transistor.

According to a second aspect, there is provided a method of determining junction temperature in a semiconductor device comprising: defining a relationship between an on-state resistance of the semiconductor device and the junction temperature of the semiconductor device; determining the on-state resistance of the semiconductor device; and calculating the junction temperature of the semiconductor device according to the defined relationship.

The relationship between the on-state resistance of the semiconductor device and the junction temperature of the semiconductor device may be attained by offline thermal characterisation of the semiconductor device. The method may comprise applying the offline thermal characterisation of the semiconductor device to the determined on-state resistance of the semiconductor device.

A control signal and/or alert for the semiconductor device may be output based upon the calculated junction temperature.

According to a further aspect, there is provided a data carrier comprising machine readable instructions for operating one or more processor in a system for monitoring a power electronics device to monitor the junction temperature of the semiconductor device by: accessing a stored relationship between the on-state resistance of the semiconductor device and the junction temperature of the semiconductor device; receiving one or more sensor signal for the semiconductor device and determining from the one or more sensor signal an on-state resistance value for the semiconductor device; and calculating the junction temperature of the semiconductor device according to the stored relationship.

The data carrier may comprise a data storage medium, e.g. a non-volatile data storage device.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

BRIEF DESCRIPTION OF THE DRAWINGS

Embodiments will now be described by way of example only, with reference to the Figures, in which.

DETAILED DESCRIPTION

The present disclosure proposes the use of IGBT on-state resistance as a temperature sensitive electrical parameter to extract the IGBT junction temperature.

In this proposed method, the junction temperature is calculated using the characteristic of the IGBT that the on-state resistance is a function of the junction temperature. This approach consists of two processes: off-line thermal characterization of the IGBT with respect to the on-state resistance, and on-line estimation of the on-state resistance and subsequent extraction of junction temperature based on the characterized data.

Figure 1:
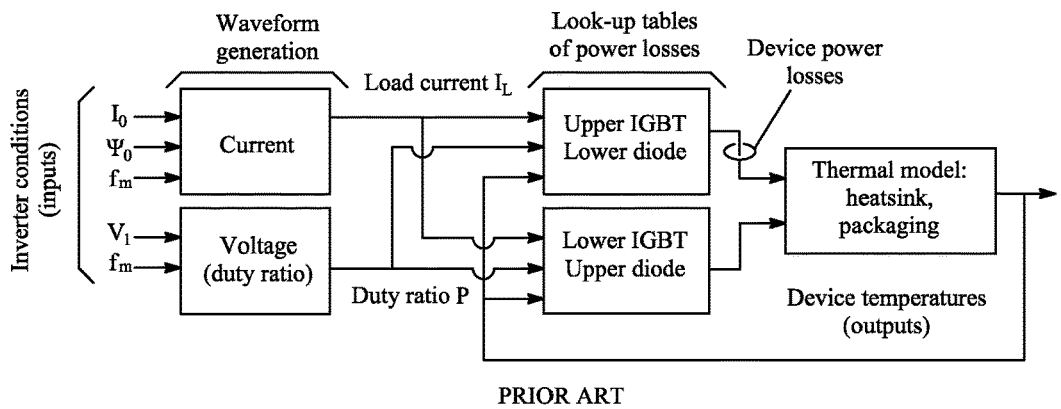
FIG. 1 is an example of a first conventional method for determining the junction temperature of a semiconductor device.
Figure 2:
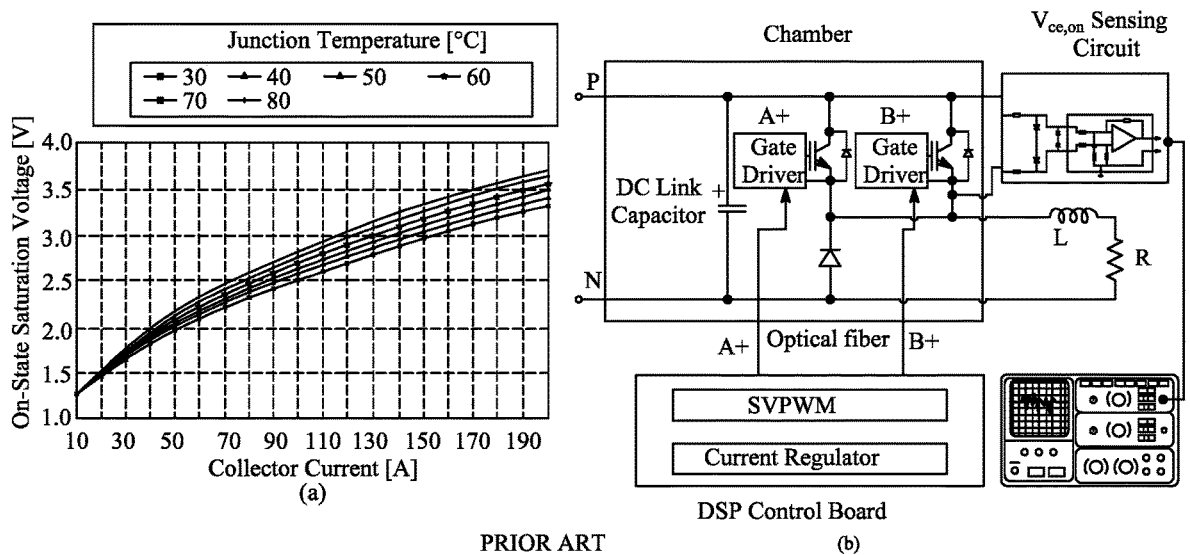
FIG. 2 is an example of a conventional method for determining the junction temperature of a semiconductor device.
Figure 3:
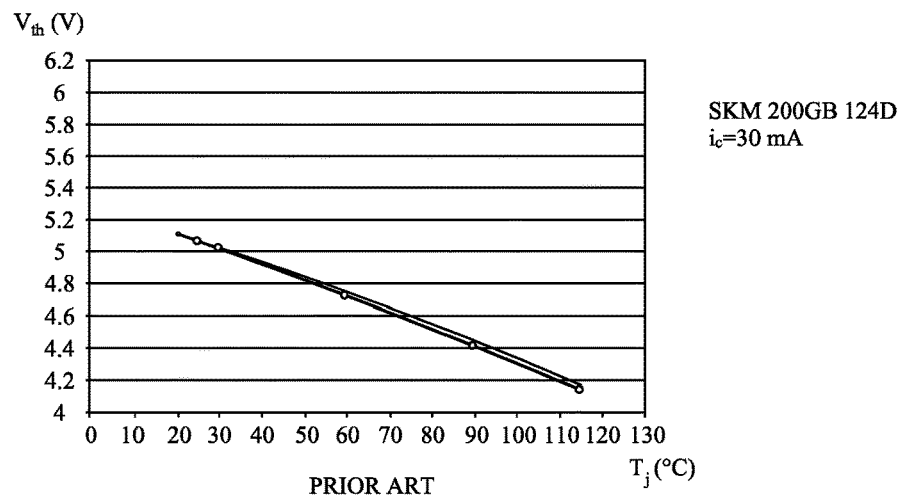
FIG. 3 is a graph illustrating threshold voltage temperature dependence for different samples of the same IGBT type.
Figure 4:
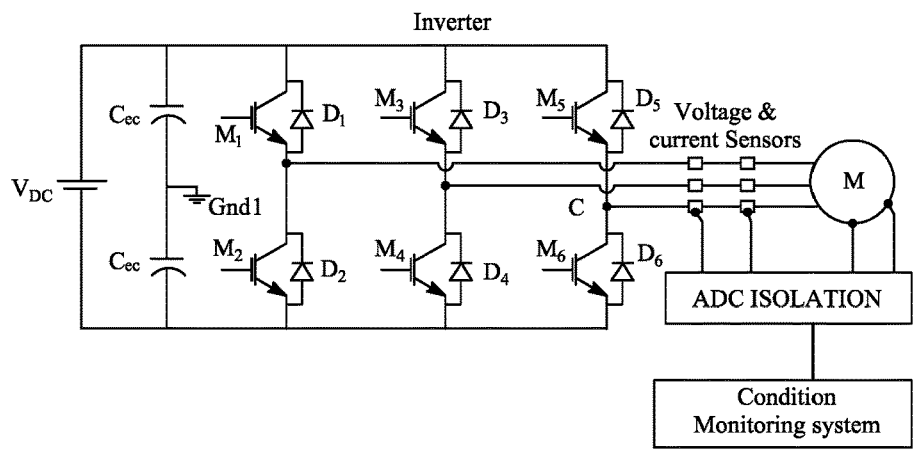
FIG. 4 is a block diagram of an example implementation of the junction temperature prediction model in a power converter system.

FIG. 4 illustrates an example system for monitoring a power electronics device. Here, the power electronics device is an inverter, however it will be appreciated that the power electronics device could be any power electronics device to which the present disclosure is applicable.

The example system comprises a number of voltage and current sensors configured to measure the phase current and phase voltage of the inverter. The voltage sensors may be standard voltmeters. The current sensors may be standard ammeters.

The example system further comprises a condition monitoring system. The condition monitoring system comprises at least one processor configured to monitor the junction temperature of the IGBT in the inverter.

Figure 5:
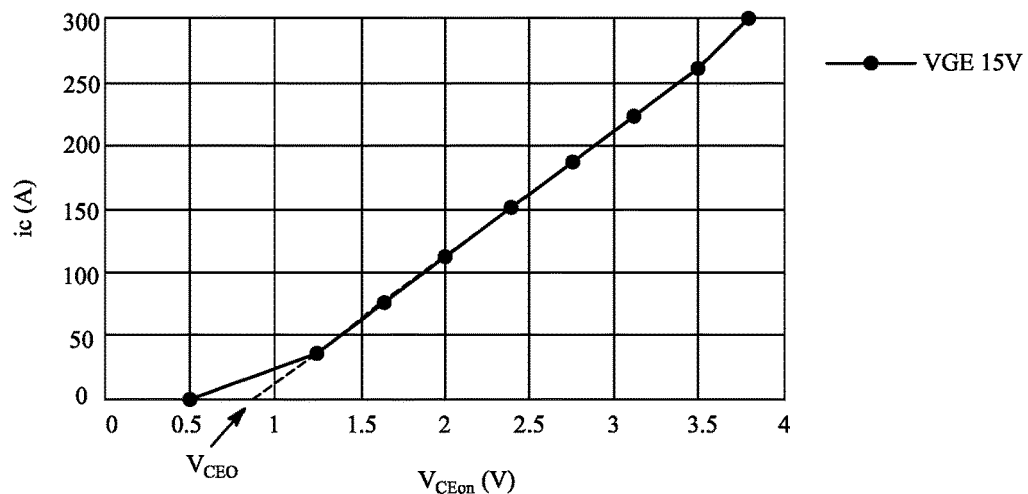
FIG. 5 is a graph illustrating the typical output characteristics of an insulated-gate bipolar transistor (IGBT) for a constant gate voltage and a constant junction temperature.

FIG. 5 illustrates typical output characteristics of an insulated-gate bipolar transistor (IGBT) for a constant gate voltage and a constant junction temperature. From the output characteristics, at a given current, the voltage drop between collector and emitter can be calculated as:

$$V_{CEon}(t) = V_{CEO} + i_c(t) * r_{CE} \qquad (1)$$

where $V_{CEO}$ represents the collector-emitter threshold voltage, $r_{CE}$ represents the initial on-state resistance, $i_c$ represents the device current, and $V_{CEon}(t)$ represents the collector-emitter on-state voltage.

By rearranging equation (1), the device on-state resistance can be expressed as:

$$r_{CE} = \frac{[V_{CEon}(t) - V_{CEO}]}{i_c(t)} \qquad (2)$$

where the initial value of the collector-emitter threshold voltage ($V_{CEO}$) can be taken from the semiconductor device manufacturer specification sheet.

Figure 6:
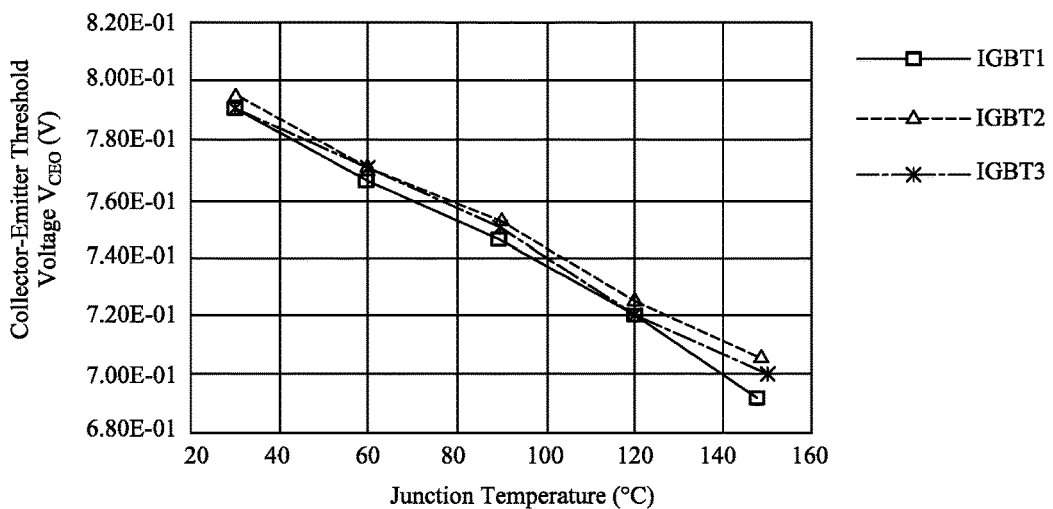
FIG. 6 is a graph illustrating measured collector-emitter threshold voltage data with respect to junction temperature.

FIG. 6 illustrates measured collector-emitter threshold voltage data with respect to junction temperature. The collector-emitter threshold voltage has a strong dependency on the junction temperature ($T_j(t)$), which itself is considered as a time varying quantity. Hence, the equation given in (2) can be written as:

$$r_{CE\_est} = \frac{[V_{CEon}(t) - (V_{CEO}(T_j(t)))]}{i_c(t)} \qquad (3)$$

The temperature dependency of collector-emitter threshold voltage can therefore be expressed as a function of junction temperature, as:

$$V_{CEO}(T_j(t)) = V_{CEO} * (a_1 * T_j(t) + a_2) \qquad (4)$$

where coefficients $a_1$ and $a_2$ can be obtained using device specification sheer, or by off-line thermal characterization of the collector-emitter threshold voltage ($V_{CEO}$) as a function of junction temperature.

Figure 7:
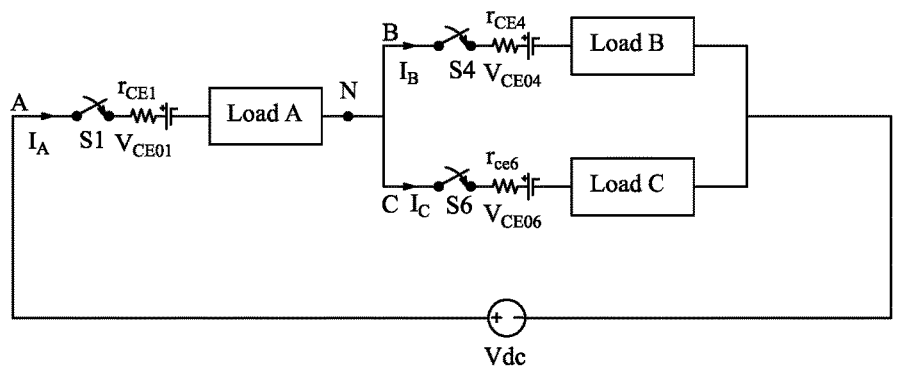
FIG. 7 is a circuit diagram illustrating the equivalent electrical circuit of FIG. 4 when switches $s_1$, $s_4$ and $s_6$ are in the on-state.

FIG. 7 illustrates the equivalent electrical circuit of FIG. 4 when switches $s_1$, $s_4$ and $s_6$ are in the on-state. The device voltage can be obtained from the switching states of the inverter and the inverter output voltage. For example, assuming the load is balanced, the voltage drops across switch 4 and switch 6 are almost equal for the case shown in FIG. 7, and the approximate device voltage can be extracted from the output line and dc link voltage, as:

$$V_{CEon1} = [(V_{dc} - V_{ab}) - ((I_B * r_{CE4}) + V_{CE04})] \qquad (5)$$

where (5) is valid only when $s_1$, $s_4$, and $s_6$ are ON and $I_R > 0$.

Similarly, for another switching state:

$$V_{CEon2} = [(V_{dc} + V_{ab}) - ((I_B * r_{CE3}) + V_{CE03})] \qquad (6)$$

where (6) is valid only when $s_2$, $s_3$, and $s_6$ are ON and $I_R < 0$

The default values of $r_{CE\_1}$, $r_{CE\_2}$, $r_{cE3}$, $r_{cE4}$ are obtained using eqn (2) and $V_{cE03}$, $V_{cE04}$ are taken from the device manufacture specification sheet.

The total device current can be calculated from a combination of the device currents in the inverter system of FIG. 7. Each device current in the inverter system can be extracted from the load phase currents using the reconstruction technique. The device currents are mathematically reconstructed as:

$$\begin{bmatrix} i_{c1} \\ i_{c2} \\ i_{c3} \\ i_{c4} \\ i_{c5} \\ i_{c6} \end{bmatrix} = \frac{1}{2} \begin{bmatrix} (1+\text{sign})s_1 & 0 & 0 \\ 0 & (1+\text{sign})s_2 & 0 \\ 0 & 0 & (1+\text{sign})s_3 \\ (1-\text{sign})s_4 & 0 & 0 \\ 0 & (1-\text{sign})s_5 & 0 \\ 0 & 0 & (1-\text{sign})s_6 \end{bmatrix} * \begin{bmatrix} I_A \\ I_B \\ I_C \end{bmatrix} \qquad (7)$$

where the 'sign' can be either +1 or −1, depending on the direction of load currents $I_A$, $I_B$, $I_C$.

Figure 8:
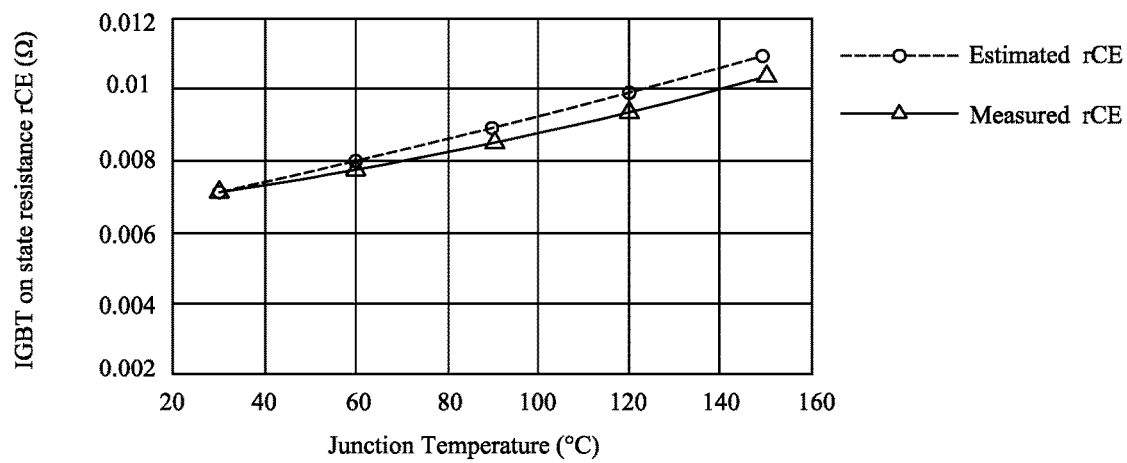
FIG. 8 is a comparison of the proposed computation method for on-state resistance with measured on-state resistance with respect to change in junction temperature.

FIG. 8 illustrates a comparison of the proposed computation method for on-state resistance with measured on-state resistance with respect to change in junction temperature for a Semikron SKM150 GB 12T4G module. The on-state resistance measurement is taken using Tektronix curve tracer equipment. From the results plotted in FIG. 8, it can be observed that the proposed estimation method follows the same pattern as the measured results, and the maximum error between measurement and estimation is approximately (±5%).

Figure 9:
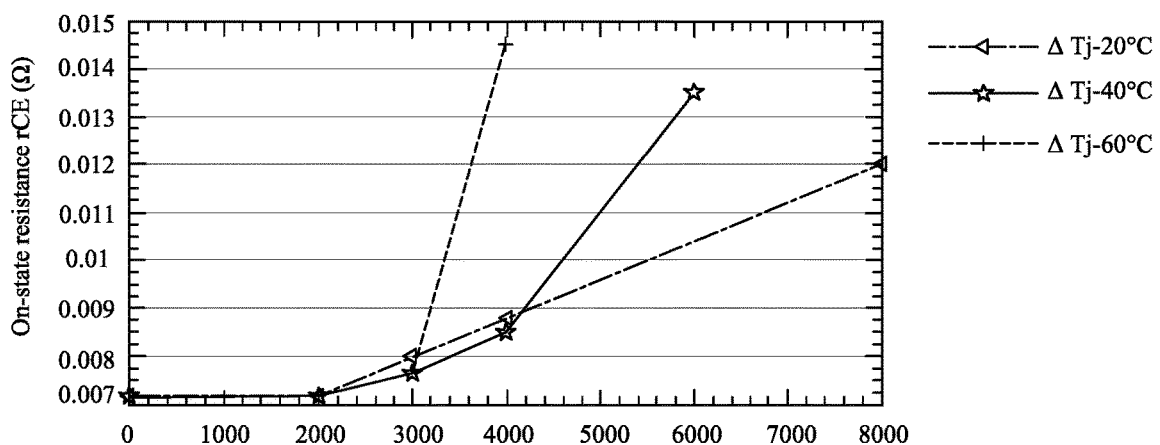
FIG. 9 is a graph illustrating how on-state resistance varies with power cycling.

This variation in on-state resistance is assigned to device degradation. FIG. 9 shows the value of on-state resistance with respect to accelerated ageing cycles. As can be seen, ageing leads to an increase in the on-state resistance in all of the tested modules. The on-state resistance increases almost 80% from the original values specified in the device data sheet. From the experimental investigation results, it can be seen that the increase in on-state resistance is directly related to the magnitude of change in junction temperature ($\Delta T_j$). In other words, the device degradation is much quicker when the magnitude of change in junction temperature is higher. Hence, when estimating on-state resistance, the device degradation must be taken into consideration to improve the accuracy of the estimation method.

The junction temperature of power device is important in estimating health of the power device using device on-state resistance. Since, device degradation easily affects the device on-state resistance and junction temperature. Therefore, it is important to take account of device degradation in estimating junction temperature. Hence, the junction temperature of the power device equal to device case temperature ($T_C$), when the temperature cycle is less than 1. And junction temperature extracted using modified on-state resistance value.

$$T_j(t) = \begin{cases} T_c(t) & \text{when temperature cycle} < 1 \\ (b_1 r_{CE\_act(t)}^2 + b_2 r_{CE\_act(t)} + b_3) & \text{when temperature cycle} > 1 \end{cases} \quad (8)$$

Where b1, b2, b3 are the temperature co-efficient of aged power devices performed offline using look-up table approach.

where $r_{ce\_act}$ is the modified on-state resistance, which can be given as:

$$r_{CE_{act(t)}} = r_{CE_{est(t)}} + r_{ce}^\alpha \quad (9)$$

where $r_{CE_{est(t)}}$ is the estimated on-state resistance using equation (3), and $r_{ce}^\alpha$ is the increase in on-state resistance due to ageing or degradation. The coefficient "α" can be extracted from degraded device samples by applying a curve fitting approach.

Figure 10:
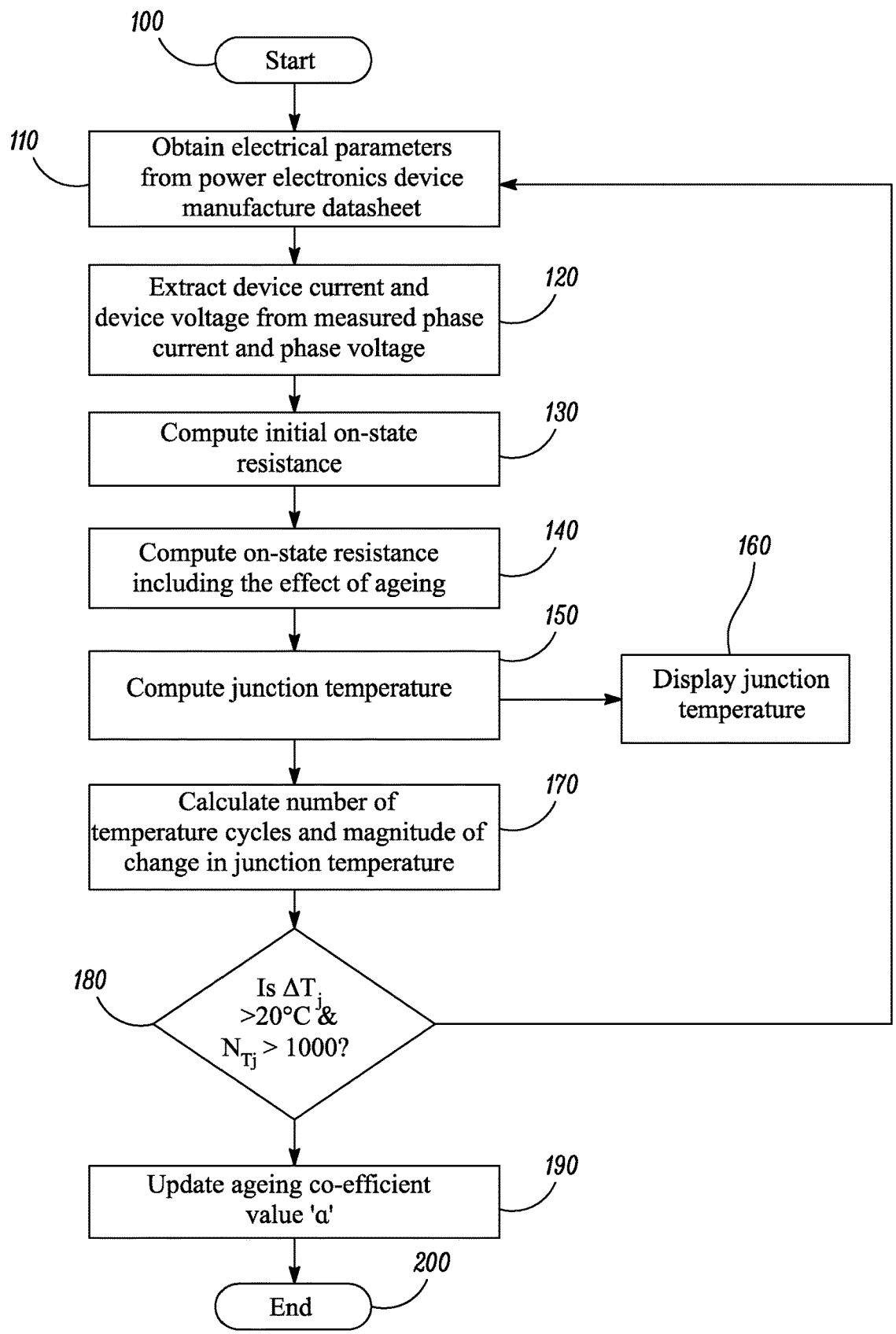
FIG. 10 is a flowchart illustrating the method by which the processor monitors the junction temperature of the semiconductor device.

FIG. 10 illustrates the method by which the processor monitors the junction temperature of the semiconductor device. At step 100, the processor initiates the monitoring process. This may occur periodically, or in response to the processor receiving a start signal, or in response to the processor receiving a signal indicating that an electrical parameter of the device reaching a predetermined threshold.

At step 110, the processor obtains any required electrical parameters which are stored from the manufacture datasheet of the power electronics device. The electrical parameters may be the collector-emitter threshold voltage (referred to as $V_{CEO}$ in formulae throughout this patent specification).

These electrical parameters are specific to each power electronics device. These electrical parameters may represent parameters which are correct at the time of manufacture of the power electronics device. These electrical parameters may be affected over time, and thus depend on the age of the power electronics device.

At step 120, the processor instructs the at least one sensor to measure the instantaneous phase current and the instantaneous phase voltage. The processor then determines the device current and the device voltage from these measured values, using equations (5), (6) and (7).

At step 130, the processor calculates the initial on-state resistance of the semiconductor device, e.g. using equation (3). A default on-state resistance ($r_{CE\_1}$, $r_{CE\_2}$, $r_{CE3}$, $r_{CE4}$) may be obtained from equation (2) without considering temperature effect. It can be updated once the processor estimates the $r_{CE_{act}}$ using equation (3) at step 130.

At step 140, the processor calculates the modified on-state resistance of the semiconductor device using equation (9). The modified on-state resistance takes into consideration the age of the semiconductor device and therefore accounts for any age degradation of the semiconductor device.

At step 150, the processor calculates the junction temperature of the semiconductor device using the modified on-state resistance of the semiconductor device according to equation (8), determined from offline thermal characterisation of the semiconductor device.

At step 160, the determined junction temperature is displayed to a user. The power electronics device may comprise a display for displaying the determined junction temperature. Alternatively, the determined junction temperature may be displayed via an external device to which the power electronics device is connected. The connection may be a wired connection or a wireless connection.

As the on-state resistance of the semiconductor device varies with the age of the semiconductor device, the degradation variation of the power electronics device is considered when estimating the junction temperature of the semiconductor device. Hence, an ageing algorithm is applied to the monitoring process, illustrated by steps 170-190 of FIG. 10.

At step 170, the processor calculates the number of performed junction temperature measurements, and the magnitude of change in junction temperature. The calculated magnitude of change in junction temperature may be the magnitude of the change in junction temperature since the first junction temperature measurement was taken. The calculated magnitude of change in junction temperature may be the magnitude of the change in junction temperature since the previous measurement was taken.

At step 180, the process decides whether the on-state resistance ageing coefficient (referred to as a in formulae throughout this specification) is to be updated. If the magnitude of change in junction temperature is calculated to be more than a first predetermined threshold and the number of junction temperature measurements taken is calculated to be more than a second predetermined threshold, then the method proceeds to step 190. If the magnitude of change in junction temperature is not calculated to be more than the first predetermined threshold and/or the number of junction temperature measurements taken is not calculated to be more than the second predetermined threshold, then the monitoring process returns to step 110, and the monitoring process is automatically repeated.

In this specific example the first predetermined threshold is 20° C. and the second predetermined threshold is 1000. It is envisaged that the first predetermined threshold may be a temperature in the range of 5-40° C., or 10-30° C. or 15-25° C.

It is envisaged that the second predetermined threshold may be a number in the range of 100-10,000 measurements, or 300-5000 measurements, or 500-3000 measurements. It is also envisaged that algorithm could operate in a mode in which only one of the first and second predetermined thresholds needs to be met in order to update the on-state resistance ageing coefficient.

At step 190, the processor updates the on-state resistance ageing coefficient. The processor stores the updated on-state resistance ageing coefficient for future calculation of the on-state resistance of the semiconductor device, and hence the future determination of the junction temperature of the semiconductor device.

If, at step 180, it is decided that the on-state resistance ageing coefficient is to be updated, then after the on-state resistance ageing coefficient is updated, at step 200, the processor ends the monitoring process. The monitoring process may be re-initiated, using the updated on-state resistance ageing coefficient, after a predetermined time period has elapsed, or in response to the processor receiving a start signal, or in response to the processor receiving a signal indicating that an electrical parameter of the device reaching a predetermined threshold.

In response to the estimated junction temperature being greater than a third predetermined threshold, the power electronics device may provide a signal to shut down the power electronics device, and/or to schedule maintenance and/or repairs and/or replacement of the power electronics device.

The signal may be a visual signal. The visual signal may be displayed on a display of the power electronics device. Alternatively, the visual signal may be displayed on an external device connected to the power electronics device.

Alternatively, or additionally, the signal may be an audio signal. The audio signal may be emitted from the power electronics device. Alternatively, the audio signal may be emitted from an external device connected to the power electronics device.

Figure 11:
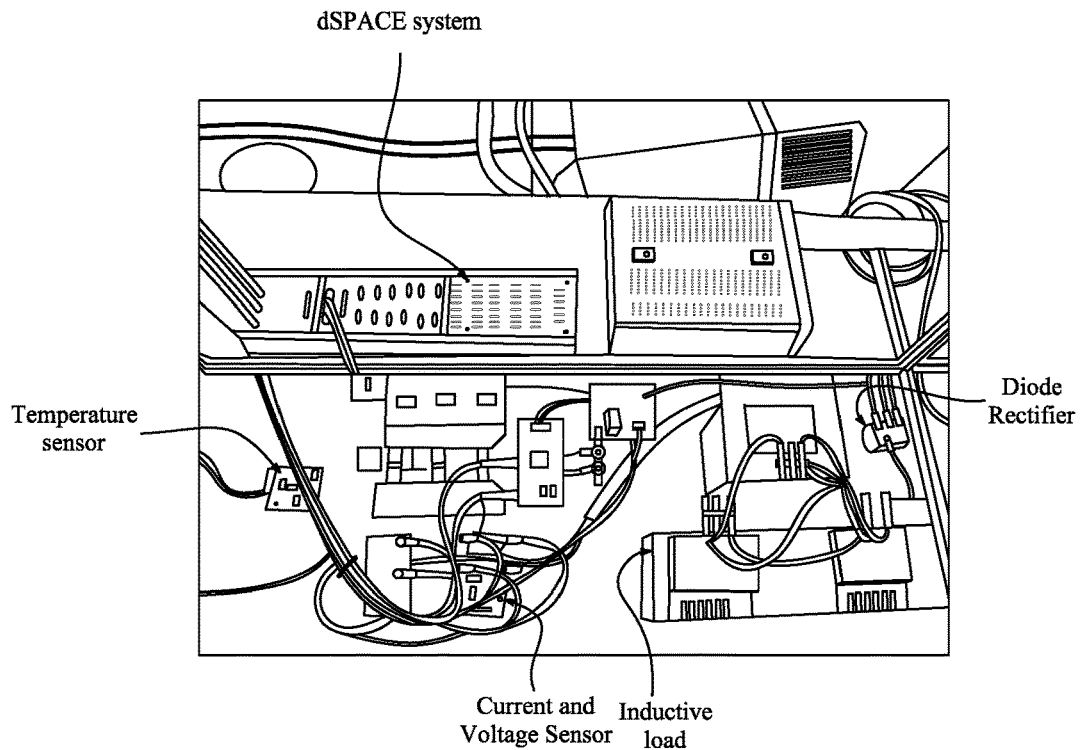
FIG. 11 is a diagram of a three-phase inverter rig developed for testing of the method by which the processor monitors the junction temperature of the semiconductor device.

In order to validate the developed junction temperature estimation method, a three-phase inverter rig was developed, as shown in FIG. 11. The junction temperature is measured by employing a calibrated thermocouple closure to a die of the device (this is achieved by removing the casing of the device and placing the thermocouple in the device).

Figure 12:
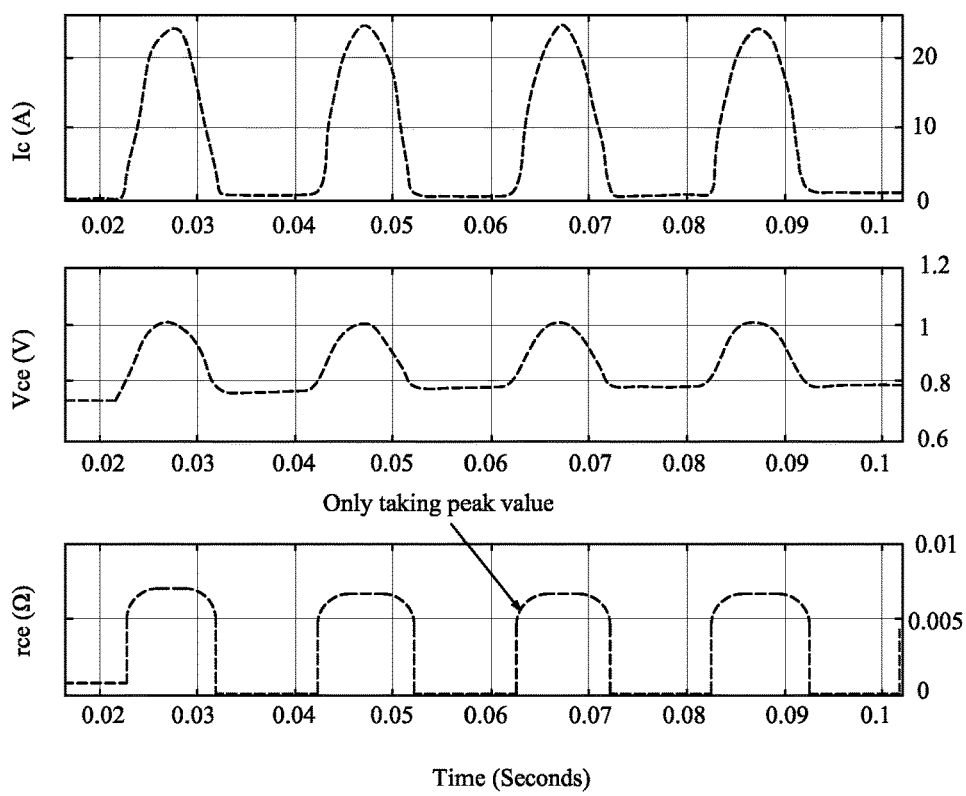
FIG. 12 is a graph illustrating estimated device current, device voltage and on-state resistance according to the method by which the processor monitors the junction temperature of the semiconductor device.

FIG. 12 shows the experimental results of the estimated device current, the estimated voltage and the calculated on-state resistance of an IGBT module. The devices were tested with a load current of 25 A and a switching frequency of 5 Khz. It can be seen from FIG. 12 that the estimated on-state voltage, and the estimated on-state resistance follow the device current pattern. The error between the estimated on-state voltage and the specified on-state voltage in the device data sheet is less than 2%. The error between the calculated on-state resistance and the stated on-state voltage in the device data sheet is less than 1%.

Figure 13:
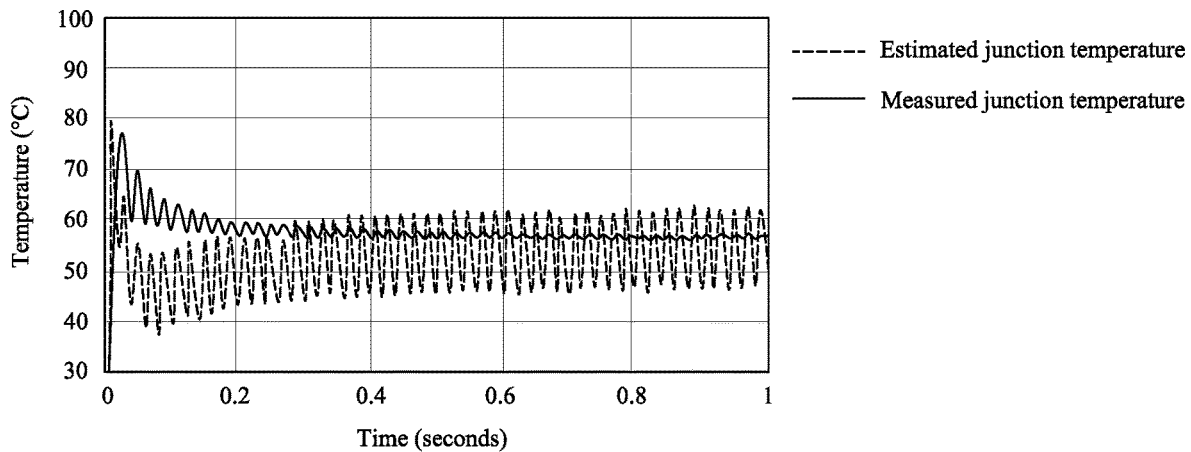
FIG. 13 is a graph illustrating an unfiltered comparison of the measured junction temperature and the estimated junction temperature according to the method by which the processor monitors the junction temperature of the semiconductor device.
Figure 14:
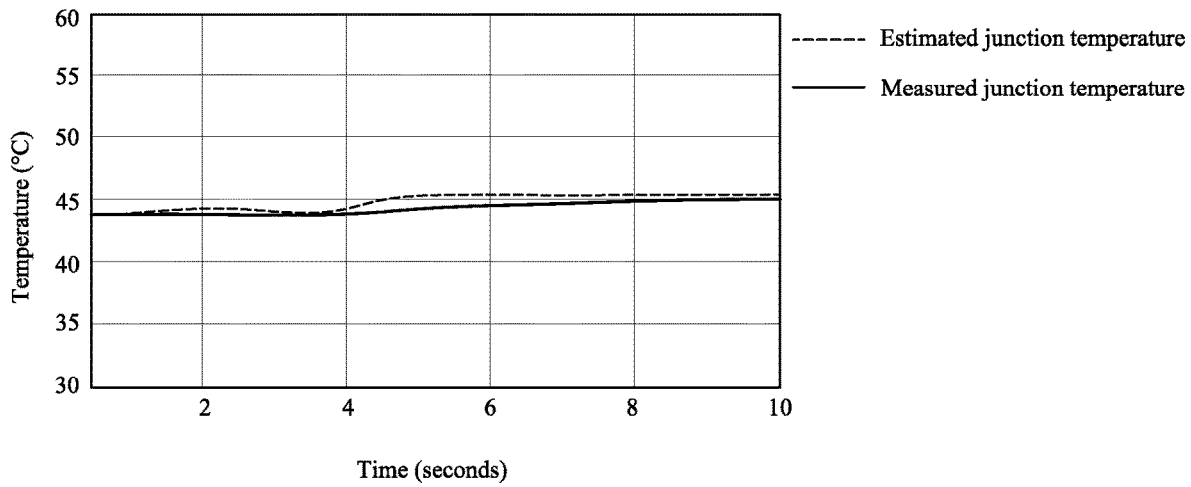
FIG. 14 is a graph illustrating a comparison of the measured junction temperature and the estimated junction temperature according to the method by which the processor monitors the junction temperature of the semiconductor device, over a 10 second period.

FIG. 14 shows the experimental results of the estimated junction temperature. The devices were tested with a maximum load current of 30 A and a switching frequency of 5 Khz. It can be seen from FIG. 13 that the estimated junction temperature for a constant current profile follows the measured junction temperature, and the error between the estimated junction temperature and the measured junction temperature is less than 5%.

Figure 15:
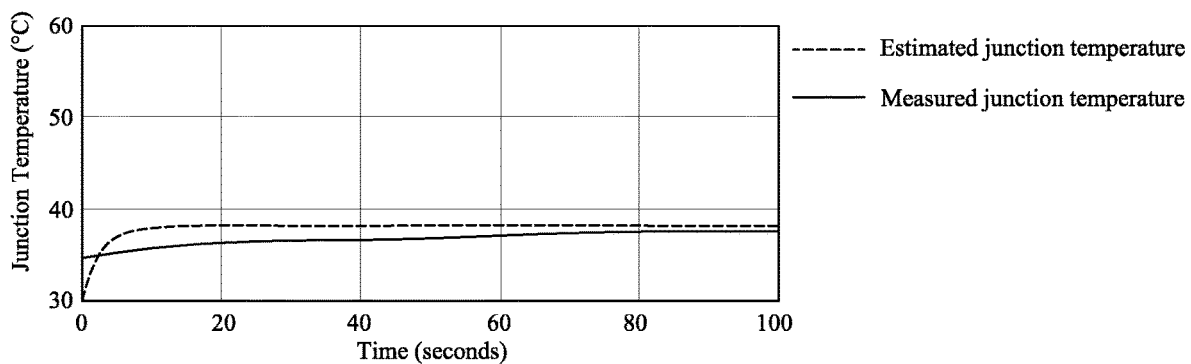
FIG. 15 is a graph illustrating a comparison of the measured junction temperature and the estimated junction temperature according to the method by which the processor monitors the junction temperature of the semiconductor device, over a 100 second period.

To verify the accuracy of the developed method in transient conditions, the three-phase converter circuit was energized by a dynamic load current profile. The corresponding results were filtered, and are plotted in FIGS. 15 and 16. It can be seen that the model shows good accuracy in transient conditions. The initial temperature error at the start of the experiment is within ±7.2% and decreases to ±3%.

The system and methods described herein may be advantageous in that accurately estimating the junction temperature of the semiconductor device enables an accurate failure prognosis of the entire power electronics device. That is, the system and methods described herein may allow accurate determination of when the system is likely to fail. In aerospace and marine applications, for example, this allows forward planning of any maintenance, repair or replacement required for the system. The system and methods described herein may therefore be advantageous in preventing the system from reaching failure, reducing unplanned maintenance, enhancing the system availability and/or providing significant cost savings for the system owner.

The system and methods described herein may also be advantageous in that the proposed method uses existing current and voltage information to calculate the junction temperature of the semiconductor device. Unlike conventional temperature sensitive electrical parameter methods, the system therefore doesn't require any additional/bespoke sensing elements, any complex filtering circuits, or any external measurement circuitry. This may allow the proposed method to be applied to conventional "off the shelf" power electronics equipment.

The proposed solutions described herein may be applicable to low power and high power systems that employ power switches. Health monitoring of devices as described herein may be used to improve the reliability and maintainability of power electronics converters. Knowledge of junction temperature can be used to protect the device, e.g. as a control parameter or threshold. Examples of functionality that could be enabled by the solutions proposed herein include:

- to implement safe shutdown when the temperature goes excessively high (e.g. during an instance of use);
- to output an alert (e.g. to a user or monitoring facility) when the IGBT device is operated above a predetermined junction temperature
- to control a converter such that a risk of premature failure is reduced or prevented (e.g. due to repeated excessive thermal stress reducing device life time and increasing the likelihood of premature failure)
- to allow controlled operation of the device outside/above a rated condition confidently (e.g. the temperature can be predicted for the entire operating range and so operation above the rated condition can be implemented to achieve a particular mission profile);
- developing/implementing prognostic and/or remaining useful-/operational time estimation capability by using thermal cycle calculation;
- ability to develop advanced control algorithms to prolong the device life through active thermal control and through advanced temperature control techniques;
- prediction of the junction temperature of the semiconductor switch at any instant during transient and intransient conditions.
- use of junction knowledge to improve system reliability, performance and/or weight design of the power system.

The solutions proposed herein may be applied across number of applications that use power semiconductor devices such as IGBT, MOSFET, etc and devices manufactured from different material such as Si, SiC, GaN etc. The application could comprise grid connected inverters and power converters used solar, fuel cell, and wind. Industrial drives may be accommodated, such as variable speed drives used for controlling pumps, rolling mills etc. DC-DC converters may also be accommodated as used in various switch mode power supplies, solid state power controllers, etc.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A system for monitoring a power electronics device, the system comprising:
   a semiconductor device having a case;
   at least one sensor; and
   a processor,
   wherein the processor is configured to monitor a junction temperature of the semiconductor device by:
      determining from the at least one sensor an on-state resistance of the semiconductor device, and
      calculating the junction temperature of the semiconductor device according to a relationship between the on-state resistance of the semiconductor device, based on aged samples lookup table data, and a case temperature of the semiconductor device.

2. A system according to claim 1, wherein the relationship comprises a mathematical relationship, lookup table, or graph correlating aged on-state resistance values with case temperature values and junction temperature values.

3. A system according to claim 1, wherein the relationship comprises a mathematical curve definition or a non-linear regression model.

4. A system according to claim 1, wherein the power electronics device is a power converter.

5. A system according to claim 1, wherein the semiconductor device is an insulated-gate bipolar transistor.

6. A system according to claim 1, wherein the processor outputs at least one of a control and an alert signal for the semiconductor device based upon the calculated junction temperature being greater than a threshold value.

7. A system according to claim 6, wherein, in response to the calculated junction temperature being greater than the threshold value, the processor outputs a signal to at least one of:
   shut down the power electronics device,
   limit further operation of the power electronics device, and
   at least one of schedule maintenance, repair, and replacement of the power electronics device.

8. A system according to claim 1, wherein the at least one sensor comprises at least one of a current sensor and a voltage sensor.

9. A system according to claim 8, wherein at least one of a phase current and a phase voltage is sensed by the sensor.

10. A system according to claim 9, wherein the processor extracts from at least one of the sensed phase current and the sensed phase voltage at least one of a semiconductor device current and a semiconductor device voltage.

11. A system according to claim 1, wherein the processor determines the on-state resistance based on an output of the at least one sensor and an age of the semiconductor device by calculating a modified on-state resistance of the semiconductor device dependent on the age of the semiconductor device.

12. A system according to claim 11, wherein the processor applies an ageing coefficient ($\alpha$) to the on-state resistance.

13. A system according to claim 12, wherein the processor determines at least one of a change in the junction temperature and a number of junction temperature calculations, and
   the ageing coefficient is updated in response to at least one of the change in the junction temperature being more than a first predetermined threshold and the number of junction temperature calculations effected being more than a second predetermined threshold.

14. A method of determining a junction temperature in a semiconductor device, the method comprising:
   determining an on-state resistance of the semiconductor device;
   calculating the junction temperature of the semiconductor device; and
   defining a first relationship between the on-state resistance of the semiconductor device and the junction temperature of the semiconductor device,
   wherein the junction temperature of the semiconductor device is calculated according to a second relationship between the on-state resistance of the semiconductor device, based on aged samples lookup table data, and a case temperature of the semiconductor device.

15. A method according to claim 14, further comprising outputting at least one of a control signal and an alert for the semiconductor device based upon the calculated junction temperature.

16. A method according to claim 14, wherein the first relationship is attained by offline thermal characterisation of the semiconductor device.

17. A method according to claim 16, further comprising applying the offline thermal characterisation of the semiconductor device to the determined on-state resistance of the semiconductor device.

18. A data carrier comprising machine readable instructions for operating at least one processor in a system for monitoring a power electronics device to monitor a junction temperature of a semiconductor device by:
   receiving at least one sensor signal and determining from the at least one sensor signal an on-state resistance value of the semiconductor device;
   calculating the junction temperature of the semiconductor device; and
   accessing a stored first relationship between the on-state resistance of the semiconductor device and the junction temperature of the semiconductor device, and
   wherein the junction temperature of the semiconductor device is calculated according to a second relationship between the on-state resistance of the semiconductor device, based on the stored first relationship, and a case temperature of the semiconductor device.

* * * * *